United States Patent [19]

Leicht et al.

[11] Patent Number: 5,319,243

[45] Date of Patent: Jun. 7, 1994

[54] ELECTRONIC ASSEMBLY WITH FIRST AND SECOND SUBSTRATES

[75] Inventors: Günter Leicht, Stegaurach; Bernhard Schuch, Neusitz, both of Fed. Rep. of Germany

[73] Assignee: Temic Telefunken microelectronic GmbH, Heilbronn, Fed. Rep. of Germany

[21] Appl. No.: 841,534

[22] Filed: Feb. 26, 1992

[30] Foreign Application Priority Data

Mar. 14, 1991 [DE] Fed. Rep. of Germany ....... 4108154

[51] Int. Cl.$^5$ ............................................. H01L 23/02
[52] U.S. Cl. .................... 257/692; 257/701; 257/723; 257/724
[58] Field of Search ............. 357/74, 72; 257/723, 257/725, 724, 183, 347, 350, 352, 523, 692, 713, 712, 728, 762, 758, 700

[56] References Cited

U.S. PATENT DOCUMENTS

| | | | |
|---|---|---|---|
| 4,783,695 | 11/1988 | Eichelberger | 257/723 |
| 4,907,068 | 3/1990 | Amann et al. | 257/724 |
| 5,052,005 | 9/1991 | Tanaka et al. | 357/72 |

FOREIGN PATENT DOCUMENTS

| | | |
|---|---|---|
| 2460635 | 6/1976 | Fed. Rep. of Germany . |
| 2554965 | 7/1976 | Fed. Rep. of Germany . |
| 3320275 | 12/1983 | Fed. Rep. of Germany . |
| 3735455 | 9/1988 | Fed. Rep. of Germany . |
| 3942392 | 6/1990 | Fed. Rep. of Germany . |
| 3905657 | 8/1990 | Fed. Rep. of Germany . |

OTHER PUBLICATIONS

Nigel Gardner et al., "Gewinn durch Oberflächenmontage"; in der elektroniker, Nr. 4, 1987, pp. 41–46.

Gerhard Taubitz "Miniaturleiterplatten für die moderne Mikroelektronik"; in Elektronik, 23/Nov. 16, 1984 pp. 125–129.

W. Martin et al., "DCB-Substrate für die Leistungselektronik-Eigenschaften und Anwendungen"; in Sonderteil in Hanser-Fachzeitschriften, Nov. 1990, pp. ZM198-204.

Jerry Lymann, "Thick And Thin Film Battle For Growing Hybrid Market"; in Electronics, H. 28, Aug. 7, 1986, pp. 88–92.

I. Feinberg et al., "Interposer For Chip-On-Chip Module Attachment"; in IBM Disclosure Bulletin, vol. 26, No. 9, Feb. 1984, pp. 4590–4591.

Primary Examiner—William Mintel
Assistant Examiner—Roy Potter
Attorney, Agent, or Firm—Spencer, Frank & Schneider

[57] ABSTRACT

In an electronic assembly whose components or circuit components are combined into at least two sub-assemblies or function units, one or more of the sub-assemblies or function units are disposed on a first substrate comprising a first substrate material. The first substrate is in its turn disposed with one or more further sub-assemblies or function units on a second substrate comprising a second substrate material.

10 Claims, 2 Drawing Sheets

ELECTRONIC ASSEMBLY WITH FIRST AND SECOND SUBSTRATES

BACKGROUND OF THE INVENTION

Circuits of electronic assemblies, for example electronic control devices, generally have as their subassemblies or function units an input stage, a digitally operating control section, and an output/power stage. Rigid or flexible plastic PCBs, ceramic substrates and leadframes are used as substrate carriers for the components and for the electrical connection lines between the components.

The costs for the substrate carrier necessary for construction of the circuit depend on the complexity of the carrier: substrate carriers wired on one plane only and with standardized circuit path widths and spacings are superior, as regards cost, to substrate carriers wired on several planes, containing substrate through-holes, and being non-standardized as regards width and spacing of the circuit paths. The cost factor is becoming increasingly influential the more the selected substrate technology approaches its technological boundaries. This generally occurs when the design of the circuit is heavily affected by space restrictions.

Particularly in those cases in which construction of the above digital control section requires the interconnection of several digital ICs with a large number of pins, either a large amount of space or a sophisticated technology is required on the substrate carrier purely for the circuit path connection—quite apart from the disproportionately high space requirement of the housings used in relation to the semiconductor chip proper.

SUMMARY OF THE INVENTION

The object underlying the invention is to reduce both the effort and the cost of manufacturing electronic assemblies, and at the same time to reduce the space requirement of subassemblies.

This object generally is attained in accordance with the invention by an electronic circuit assembly comprising a plurality of subassemblies each including a plurality of interconnected circuit components, with at least one of the subassemblies comprising a silicon substrate provided with a single layer connecting circuit path structure, and a plurality of unhoused silicon integrated circuits mounted on the silicon substrate and interconnected via the single layer connecting circuit path structure. The silicon substrate and at least one further of the subassemblies are mounted on a second substrate of a material different than silicon and electrically interconnected to form the circuit assembly.

The second substrate may be, for example, a ceramic substrate for a hybrid circuit, a printed circuit board which is rigid or flexible, or a leadframe. Preferably, additional passive or active circuit component elements are provided on the silicon substrate. Moreover, according to further features of the invention, the silicon substrate may be glued onto the second substrate, may be connected to the second substrate by soldering, or may be connected to the second substrate by bonding.

In accordance with the invention, a special construction and connection technique for electronic assemblies is provided that combines two different substrate technologies—preferably silicon planar technology and, for example, hybrid technology on a ceramic substrate or PCB (printed circuit board) technology on a plastic substrate. Various sub-assemblies or function units can be constructed using the substrate technology that involves the optimum costs for it.

In the case of the functional subdivision of the electronic control device, described at the outset, it is an advantage to place the sub-assembly of the digital control unit on a silicon substrate containing exclusively interconnect paths and a passivation layer; the required interconnect path widths and spacings present no problem at all here. Digital ICs are placed as unhoused semiconductor chips onto the silicon substrate, for example by glueing, and their connection pads are connected to the interconnect paths of the substrate—for example by bonding; in addition, further semiconductor elements and passive components can be provided, for example by glueing. The sub-assembly thereby obtained can either be mounted on a leadframe, bonded and remolded into a housing which is then fitted onto a second substrate carrying the remainder of the components of the overall assembly, or the sub-assembly can be placed directly onto a second substrate—for example onto a ceramic hybrid circuit—carrying the remainder of the components of the overall assembly, for example by glueing and bonding. In both cases, the interconnect path connection of the components on the second substrate can—since the latter is now freed of the wiring of the digital ICs—with only one metallization layer—be achieved with standardized interconnect path widths and spacings and without substrate through-contacts. The costs for manufacturing the subassembly—on an extremely simple silicon substrate—are more than offset by the simplification of the structure of the overall assembly and in particular by the extreme simplification of the second substrate carrying this assembly. In addition to easier mounting, it is furthermore possible to achieve high quality (reliability and yield) thanks to the easily mastered substrate technologies that are applied.

BRIEF DESCRIPTION OF THE DRAWING

The invention is described in greater detail in the following, with reference to the drawing figures wherein.

DESCRIPTION OF THE PREFERRED EMBODIMENTS

Figure 1:
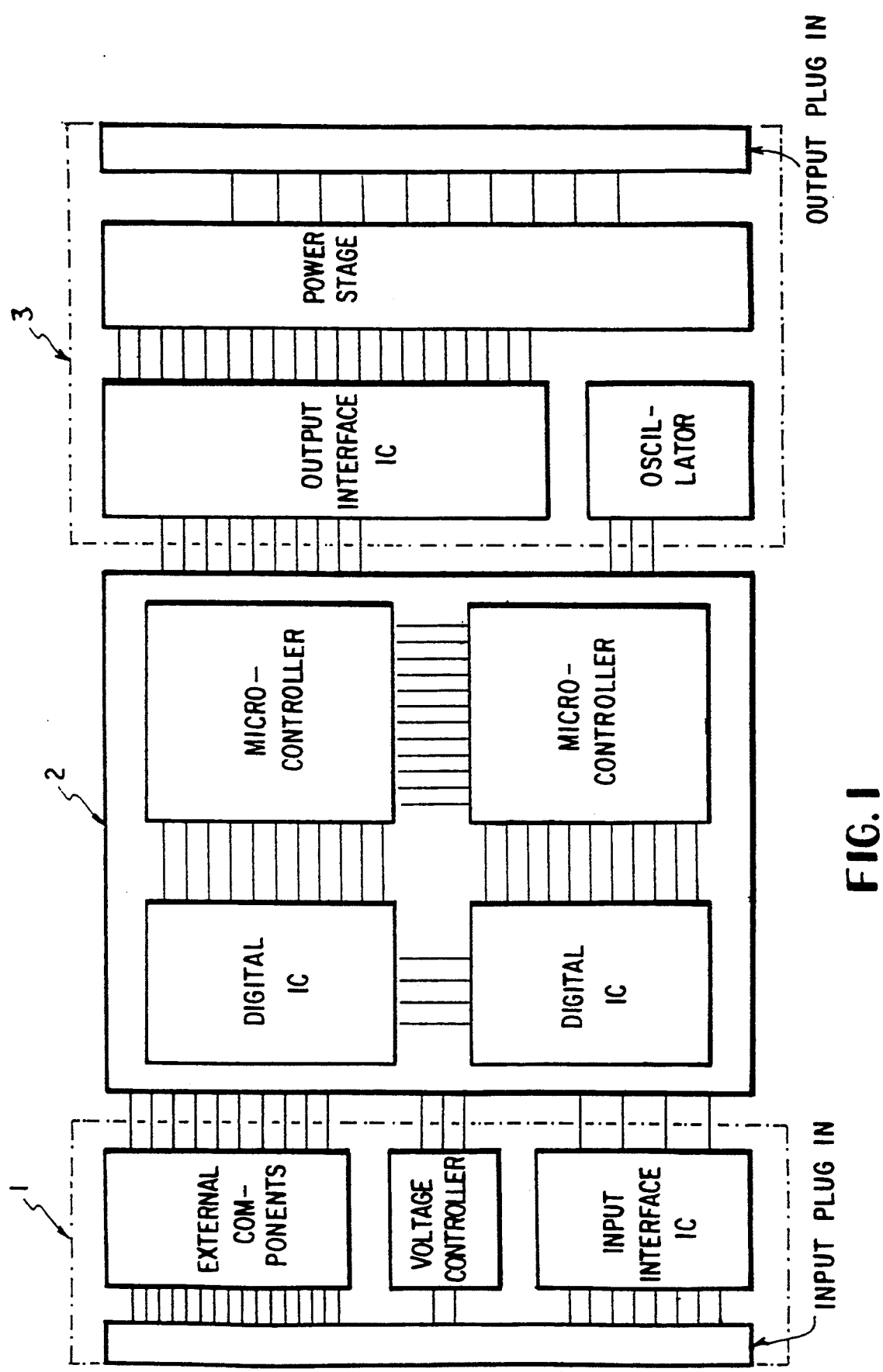
Figure 1 shows the principle circuit diagram of a control device according to the invention for the automotive industry and FIG. 2 is a schematic perspective view of an embodiment of the invention.

In accordance with the FIG. 1, the function units of the motor vehicle control device comprise input stage 1, control/checking section 2, and output stage 3, with the control/checking section 2 employing silicon technology, and the input stage 1 and the output stage 3 thick-film hybrid technology, for example. The input stage 1 comprises, for example, an input plug, external circuit components, a voltage regulator, and an input interface IC of, for example, bipolar design. The control/checking section 2 comprises, for example, four integrated circuits, for example in CMOS technology; for example, two digital ICs for data processing and storage and two microcontrollers for signal processing are provided. The output stage is constructed, for example, from an output interface IC (bipolar), an oscillator, a power stage and an output plug. Silicon technology uses a standard silicon substrate—area of $17 \times 15$ mm$^2$ for example—, an interconnect path layer—for example, sputtered or vapor-deposited aluminum interconnect paths of 1 $\mu$m thickness, 50 $\mu$m width and 50 $\mu$m spacing—and a passivation layer. The four digital integrated circuits described above are glued as chips onto the silicon substrate, and then bonded onto the latter ("chip-and-wire" technique). The silicon substrate ("multi-chip module") is then glued onto the substrate of the hybrid circuit and connected to the sub-assemblies of the hybrid circuit, for example by soldering or bonding, so that the function of the overall circuit is assured.

A ceramic aluminum substrate—with an area of $50 \times 60$ mm$^2$, for example—is used for the thick-film hybrid technology, onto which substrate only one conductor layer—for example 200 $\mu$m width, 200 $\mu$m spacing—is disposed; here too, only one passivation layer is required. All semiconductor elements are provided using the chip-and-wire technique described above, and all SMD (surface mounted device) elements are glued on. Compared with a conventional design of the control device—total hybrids are 7400 mm$^2$—the space requirement is now only 4200 mm$^2$. Expensive through-holes can be dispensed with, since a multi-layer structure is no longer necessary.

Figure 2:
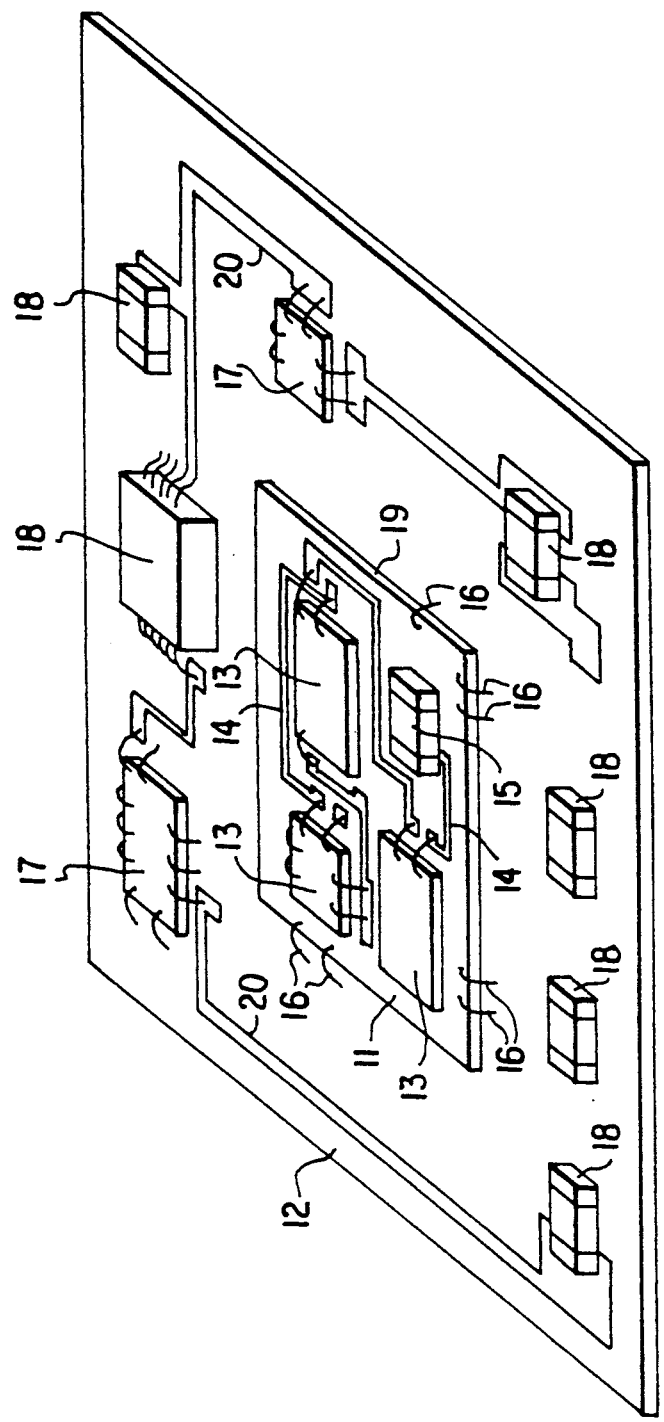

Turning now to FIG. 2 there is shown a perspective view of an embodiment of the invention including two subassemblies or functional units which are constructed and interconnected according to the invention. The first subassembly or functional unit includes a silicon substrate 11 having a plurality of unhoused integrated circuits (chips or dice) 13 mounted on one surface of the silicon substrate 11 and interconnected via interconnecting conductor lines 14 (only some of which are shown for reasons of clarity) arranged in a single metal layer which is likewise disposed on the surface of the silicon substrate 11. If necessary or desired, additional active or passive component(s) 15 may likewise be disposed on the surface of the silicon substrate 11 and connected to the interconnecting conductor lines 14.

The second subassembly includes a substrate 12, which is formed of a material other than silicon and which may be flexible or rigid, having interconnect lines 20 on the surface thereof, only some of which are shown for reasons of clarity. Mounted on the surface of the substrate 12 of the second subassembly or functional unit are a plurality of unencapsulated active and passive components 17 as well as a plurality of active and passive housed components 18. The first subassembly or functional unit with the silicon substrate 11, which for example contains the digital circuitry of the functional group 2 of FIG. 1, is likewise mounted on the surface of the substrate 12, for example by means of an adhesive or solder connection 19, and is electrically connected to the circuit or subassembly on the substrate 12 via a plurality of connections 16 shown only schematically.

What is claimed is:

1. An electronic circuit assembly comprising a plurality of subassemblies each including a plurality of interconnected circuit components; at least one of said subassemblies comprising a silicon substrate provided with a single layer connecting circuit path structure, and a plurality of unhoused silicon integrated circuits mounted on said silicon substrate and interconnected via said single layer connecting circuit path structure; a second substrate of a material different than silicon; said silicon substrate and at least one further of said subassemblies are mounted on said second substrate and electrically interconnected to form said circuit assembly.

2. An electronic circuit assembly according to claim 1, wherein said second substrate is a ceramic hybrid circuit substrate.

3. An electronic circuit assembly according to claim 1, wherein said second substrate is a printed circuit board.

4. An electronic circuit assembly according to claim 3, wherein said printed circuit board is rigid.

5. An electronic circuit assembly according to claim 1, wherein said second substrate is a leadframe.

6. An electronic circuit assembly according to claim 1, wherein at least one of passive and active circuit components additionally are provided on said silicon substrate and connected to said single-layer connecting circuit path structure.

7. An electronic circuit assembly according to claim 1, wherein said silicon substrate is glued onto said second substrate.

8. An electronic circuit assembly according to claim 1, wherein said silicon substrate is connected to said second substrate by soldering.

9. An electronic circuit assembly according to claim 1, wherein said silicon substrate is connected to said second substrate by bonding.

10. An electronic circuit assembly according to claim 3, wherein said printed circuit board is flexible.

* * * * *